United States Patent [19]

Van Mil

[11] 4,340,869

[45] Jul. 20, 1982

[54] AMPLIFIER FOR USE IN A LINE CIRCUIT

[75] Inventor: Job F. P. Van Mil, Eindhoven, Netherlands

[73] Assignee: U.S. Philips Corporation, New York, N.Y.

[21] Appl. No.: 142,274

[22] Filed: Apr. 21, 1980

[30] Foreign Application Priority Data

May 10, 1979 [NL] Netherlands ........................ 7903663

[51] Int. Cl.³ ............................................ H03F 1/08

[52] U.S. Cl. .................................... 330/310; 330/293

[58] Field of Search ...................... 330/293, 310, 311; 179/170 R, 170 T

[56] References Cited

U.S. PATENT DOCUMENTS 4,268,798 5/1981 Reichart ............................ 330/293

*Primary Examiner*—James B. Mullins

*Assistant Examiner*—Gene Wan

*Attorney, Agent, or Firm*—Thomas A. Briody; William J. Streeter; Laurence A. Wright

[57] ABSTRACT

An amplifier for a subscriber's line circuit comprising an extra transistor whose base-emitter junction is connected across a resistor which is arranged in series with the main current path of the output transistor of the amplifier. Furthermore, a supply source is connected to the output terminal of the amplifier via the main current path of the additional transistor and an impedance for supplying at least a portion of the line current of a subscriber's line connected to the output terminal, in order to reduce the dissipation in the semiconductor elements of the amplifier.

5 Claims, 6 Drawing Figures

AMPLIFIER FOR USE IN A LINE CIRCUIT

The invention relates to an amplifier for use in inter alia a line circuit comprising an impedance, an output transistor and a d.c. voltage source. The voltage source is coupled for direct current via the main current path of the output transistor to an output terminal of the amplifier for applying, via the impedance, a direct current and an alternating current superimposed thereupon by means of the amplifier to a load, such as a wire of a subscriber's line, which is coupled to the output terminal.

BACKGROUND OF THE INVENTION

Such an amplifier used in a line circuit is known from the U.S. Pat. No. 4,041,252.

Such line circuits are used on the basis of "one per subscriber's line" in subscriber's exchanges based on time-division multiplex or small signal spatial networks. Therefore, the aim is to keep the construction cost of these line circuits as low as possible. As very large numbers are required, this requires the highest possible degree of circuit integration. The amplifier produces the alternating current as well as the direct current for the subscriber's lines. The value of the line current depends on the length of the subscriber's line. In order to be capable of supplying sufficient line current with very long lines, the voltage of the voltage source is normally 48 or 60 Volt. This means that the line current in the case of very short lines or a short circuit in the subscriber's line can be very large. Telephone administrations therefore prescribe a 400 to 800 Ohm supply resistor arranged in series with the line, by means of which the maximum line current is limited to 100 to 200 mA. Since a subscriber's line is a two-wire transmission line, each line circuit comprises for each wire an impedance and an amplifier which are constructed so that the line circuits are of a symmetrical construction. The supply resistance is formed by the two impedances, each impedance having a value of 200 to 400 Ohm. These impedances also constitute the terminating impedances of the subscriber's line. To prevent the impedances from converting common mode signals on the subscriber's line into differential mode signals, the administrations require an accuracy of approximately 0.1% for these impedances. The maximum line current, limited by means of the supply resistor, is still so high that the output transistor of the amplifier dissipates a relatively high power. So far this dissipation has been an obstacle in the endeavours to implement these amplifiers in integrated form in a cheap manner with sufficient reliability and long life for telephony purposes, for example 20 years.

It is an object of the invention at least to mitigate this drawback and to achieve an amplifier whose dissipation in the semiconductor components is low, so that it is easily integrable and satisfies the above-mentioned requirements.

SUMMARY OF THE INVENTION

The amplifier according to the invention comprises a first resistor which is arranged in series with the main current path of the output transistor. The first resistor is located between the voltage source and an output terminal is coupled to the connecting terminal. The amplifier also comprises a second transistor whose base-emitter junction is connected across the first resistor, the voltage source being coupled to the connecting terminal of the amplifier via the series arrangement of the main current path of the second transistor and the impedance.

This has the advantage that the direct current bypasses the output transistor, at least for the major part, which results in a considerable reduction of the dissipation in the output transistor.

It is true that the portion of the direct current which by-passes the output transistor flows through the second transistor, but as only a portion of the voltage is applied to the second transistor, the voltage between the collector and the emitter being set to a minimum value, particularly when the second transistor is driven to saturation by means of the impedance, the dissipation in this second transistor is limited to a low value. The dissipation then occurs predominantly in the impedance, which impedance can be located outside the integrated circuit, for example in the form of an externally connected resistor.

In one embodiment, the emitter of the output transistor is coupled to the output terminal, the collector to the voltage source via the first resistor and the emitter of the second transistor is directly connected to the voltage source. The impedance comprises a second resistor arranged between the collector of the second transistor and the output terminal. The amplifier is further characterized in that the amplifier comprises a third resistor which is arranged between the emitter of the output transistor and the output terminal of the amplifier, and in that it comprises a third transistor. The base of the third transistor is connected to the emitter of the output transistor, the emitter to the output terminal of the amplifier and the collector to the base of the output transistor. This embodiment has the advantage that the drive current and, consequently, the power in the output transistor is limited to a predetermined value.

In accordance with another embodiment, the amplifier is characterized in that it has a defined gain factor, that the impedance comprises a fourth resistor arranged between the output terminal and the connecting terminal. A feedback circuit comprising a reference voltage source is connected between the connecting terminal and the amplifier input for feeding back a portion of the voltage difference between the voltage of the connecting terminal and the voltage of the reference voltage source. This has the advantage that the fourth resistor which determines the maximum line current and which must, consequently, have a very high accuracy has a value, determined by the feedback factor, which is lower than the required value of the terminating impedance, the value difference being discounted in the second resistor. The second resistor need not be accurate and can therefore be cheap. As the value of the first resistor is low, it can be relatively cheap because little power is dissipated therein.

BRIEF DESCRIPTION OF THE DRAWINGS

The invention and its advantages will now be further explained with reference to embodiments shown in the drawings, (corresponding components of the different drawings have the same reference numerals) wherein:

Referring to FIG. 1, the embodiment of an amplifier 7 shown therein comprises an output transistor $T_1$ connected as an emitter follower. The collector of which $T_1$ is connected to the positive terminal 2 of a voltage source (not shown), the emitter to output terminal 3 and the base is coupled in a manner, not shown, to input 4 of the amplifier. The coupling between input terminal 4 and the base of transistor $T_1$ may be effected in any known suitable manner and, although required for the operation of the amplifier, is of no importance for the invention.

Figure 1:
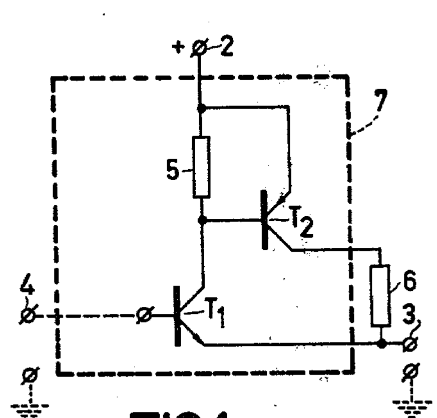
FIG. 1 shows part of an amplifier in accordance with the invention.

The amplifier is used in circuits in which an alternating current signal is applied to input terminal 4 which signal after having been amplified, is applied to output terminal 3. Also a direct current is applied to output terminal 3. The direct current having a value exceeding the amplitude of the alternating current signal, as inter alia, required for line circuits in telephony systems, particularly for subscriber's line circuits. The line current stipulated by the administrations for a line circuit and produced by means of prescribed supply voltages and supply resistances is not less than, for example, 20 mA with very long subscriber's lines and not more than, for example 120 mA with very short subscriber's lines or when there is a short-circuit on a subscriber's line. When used in a telephone line circuit, the transistor $T_1$ requires a collector voltage of approximately 5 V in order to be capable of applying an alternating current signal representing speech (applied to input terminal 4) to a wire of a subscriber's line that is coupled to output terminal 3.

Transistor $T_1$ then dissipates 0.6 Watt at the above-mentioned maximum line current. Since a line circuit comprises at least two of such amplifiers, the above-mentioned high dissipation is a serious obstacle for the implementation of such amplifiers in integrated form. To obviate this drawback a first resistor 5 is connected between the collector of transistor $T_1$ and the pole 2 of the voltage source. The amplifier comprises a second transistor $T_2$, whose base-emitter junction is connected across first resistor 5. The collector of second transistor $T_2$ is connected to output terminal 3 via a second resistor 6. The result is that transistor $T_2$ is rendered conductive when a direct current flows through resistor 5, for which the voltage across resistor 5 is equally high as the emitter-base voltage of transistor $T_2$. At a further increase of the load current this increase will flow to output terminal 3 via transistor $T_2$ and second resistor 6 so that the direct current through transistor $T_1$ and, consequently, the dissipation in the transistor $T_1$ remains limited to the above-mentioned value.

Figure 2:
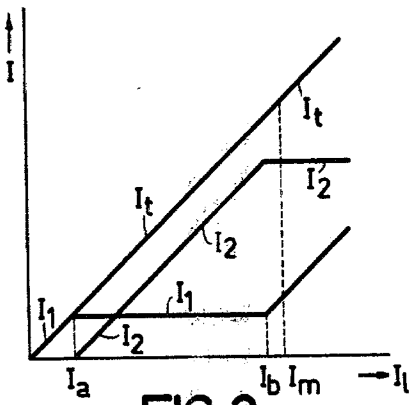
FIG. 2 is a graph wherein some of the currents occurring in the amplifier shown in FIG. 1 are shown as a function of the amplifier output current.

In FIG. 2 these currents are plotted as a function of the total load current $I_t$ taken from output terminal 3, $I_1$ being the current flowing through transistor $T_1$, $I_2$, the current flowing through transistor $T_2$ and $I_t$ being the sum of the currents $I_1$ and $I_2$. As will be apparent from FIG. 2, when the load current (line current) $I_l$ increases, it will first flow via transistor $T_1$ until the cut-off voltage of transistor $T_2$ is exceeded on the load current having reached a value $I_a$, and the further increase of the load current $I_l$ flows via transistor $T_2$, until the load current has reached the value $I_b$. At the value $I_b$ the transistor $T_2$ is saturated and the current $I_1$ through transistor $T_1$ will increase at a further current increase of the load current $I_1$.

For a load current $I_m$ the current through $I_1$ has a relatively low value, so that the dissipation in transistor $T_1$ is lower. Furthermore, transistor $T_2$ is in its saturated state so that the voltage between the collector and the emitter of this transistor is minimal which results in a low dissipation in this transistor. Almost the entire dissipation then occurs in the second resistor 6.

These measures permit the amplifier to be easily and reliably implemented in integrated form, it being possible to connect the second resistor 6, in the form of a discrete component, externally to the integrated circuit chip 7, shown in FIG. 1 by a broken line.

Practical values of the components shown in FIG. 1 are 70 Ohm for the first resistor 5 and 50 Ohm for the second resistor 6, a direct current of 10 mA flowing through transistor $T_1$ and a direct current of approximately 100 mA through transistor $T_2$.

It should be noted that the transistor $T_1$ need not be arranged as an emitter follower. The collector may, for example, be connected to the output terminal 3 and the emitter to the first resistor 5. The drive voltage at the base of this transistor $T_1$ must then be related to the supply voltage source.

Figure 3:
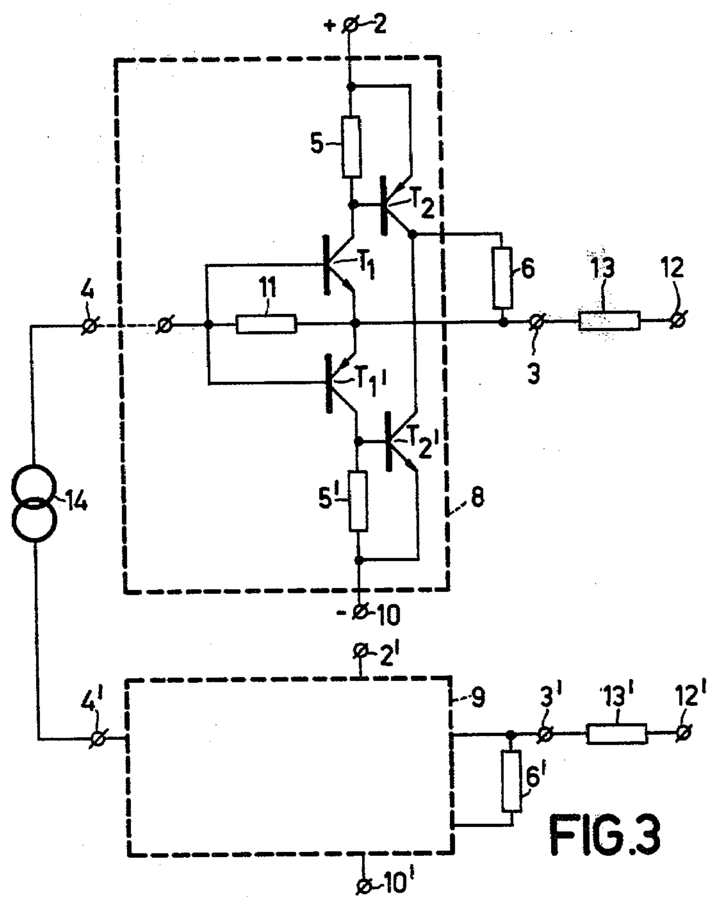
FIG. 3 shows an embodiment of a line circuit wherein the amplifier shown in FIG. 1 finds frequent usage.

The present amplifier is particularly suitable for use in a transmission bridge of a subscriber's line circuit as shown in FIG. 3. This transmission bridge comprises two identical, integrable control circuits 8 and 9. Each of these circuits comprises the amplifier of FIG. 1, with the externally connected second resistor 6. In addition, the circuits comprise a second amplifier which is complementary to the amplifier shown in FIG. 1. This second amplifier comprises an output transistor T', which is complementary to the output transistor $T_1$, a first resistor 5' and a second transistor $T_2'$ which is complementary to the second transistor $T_2$. The first resistor 5' and the emitter of the second transistor $T_2'$ are connected to the negative pole 10 of the voltage source (not shown). The collector of second transistor $T_2'$ is connected to common second resistor 6. The emitters of the output transistors $T_1$ and $T_1'$, as well as their bases, are interconnected. This does not only enable the application of direct current to the load via the output terminal 3, but direct current can also be derived from the load via output terminal 3. A resistor 11 is arranged between the bases and the emitters of output transistors $T_1$ and $T_1'$. This resistor reduces the non-linear distortion caused by the double base-emitter voltage when the conducting state of output transistor $T_1$ is taken over by the transistor $T_1'$, and visa versa. This can, alternatively, be realised in known manner by connecting one or more diodes between the bases. The output terminals 3 and 3', of circuits 8 and 9, respectively, are connected via fourth resistors 13 and 13', respectively. There resistors of circuits 8 and 9 are connected to terminals 12 and 12', respectively.

The a and b wires of a subscriber's line are connected to terminals 12 and 12'. With a positive bias voltage at the interconnected bases of transistors $T_1$ and $T_1'$ of circuit 8 and a bias voltage which is equal in magnitude, but opposite in sign at the interconnected bases of the output transistors $T_1$ and $T_1'$ of circuit 9 the direct current for this subscriber's line flows as explained in greater detail with reference to FIG. 1, from the positive pole 2 of the supply source predominantly to the terminal 12 via the second transistor $T_2$ of circuit 8, the second resistor 6, the output terminal 3, the fourth resistor 13, the terminal 12 and, via a wire of the subscriber's line to a subscriber's set, not shown, and via the other wire back to the connecting terminal 12', the fourth resistor 13', the output terminal 3' and, predominantly via the second resistor 6' and transistor $T_2'$ of circuit 9, to the negative pole 10'. If the bias voltages at the bases of the output transistors $T_1$ and $T_1'$ of the circuits 8 and 9 are interchanged, the direct current flows from the positive pole 2' via circuit 9 in a manner described above for the circuit 8 predominantly via the second resistor 6' and via output terminal 3' and to output terminal 3 in the reverse direction, as described above, further flowing predominantly via the second resistor 6 and the second transistor $T_2'$ to the negative pole 10.

So it is possible to choose and to invert the polarity of the supply voltage on the subscriber's line. The fourth resistors 13 and 13' are also used to limit the direct current, applied to the subscriber, to the maximum allowable line current. With a supply voltage of 48 V and a maximum line current of 120 mA the sum of the value of one of these resistors 13 and the value of the second resistor 6 is 200 Ohm and with a supply voltage of 60 Volt and a maximum line current of $\approx$100 mA the sum of the values is 400 Ohm. It is not only possible to feed the subscriber's line by means of the above-described circuits but it is alternatively possible to inject the speech signal into the line. To that end a speech signal current source which applies the speech signal in anti-phase to the output terminals 3 and 3' via the amplifiers is connected between the input terminals 4 and 4'. These speech signals are superimposed on the direct current by the output transistor $T_1$ and $T_1'$, respectively.

Figure 4:
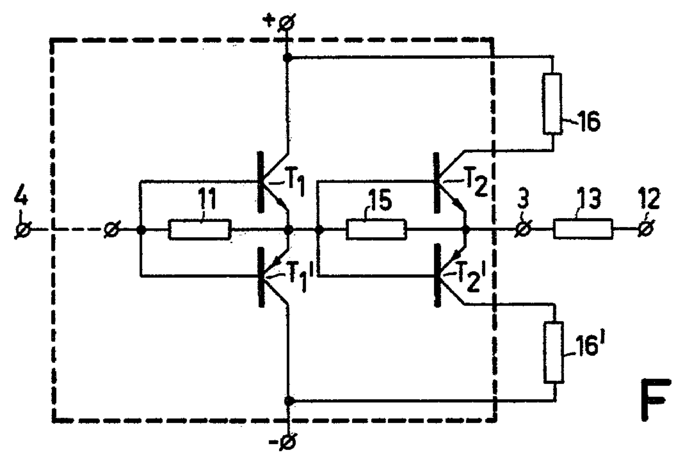
FIG. 4 shows a further embodiment of a combination, shown in FIG. 3, of two amplifiers according to the invention.

FIG. 4 shows a further embodiment of a control circuit having two complementary amplifiers. The first resistor is now not included in the collector circuit of the output transistor $T_1$ and $T_1'$, respectively, but resistor 15 is included in the emitter circuit which the two output transistors $T_1$ and $T_1'$ have in common. In addition, FIG. 4 shows that the second resistor is not included in the emitter circuit of the second transistor $T_2$ and $T_2'$, respectively, but that it may be included in the collector circuit of this transistor. These second resistors are denoted by 16 and 16', respectively.

Figure 5:
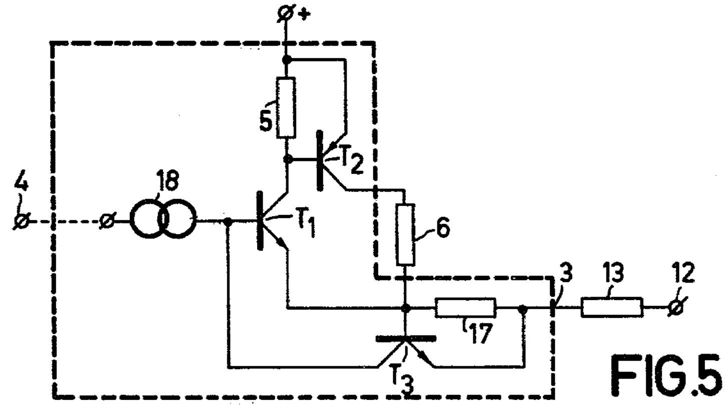
FIG. 5 shows a further embodiment of a portion of an amplifier according to the invention.

FIG. 5 shows an embodiment of an amplifier wherein also the drive current and, consequently, the current through transistor $T_2$ is limited to a predetermined value. To that end the emitter of the output transistor $T_1$ is connected to the output terminal 3 via a third resistor 17 and the fourth resistor 13 is connected to the terminal 12. The amplifier further comprises a third transistor $T_3$ which has its base connected to the emitter of the output transistor $T_1$, its emitter to the output terminal 3 and its collector to the base of the output transistor $T_1$. When a preamplifier, represented by a current source 18, supplies a predetermined drive current, the current through the main current path of the output transistor $T_1$ is so large that the voltage drop across the third resistor is equal to the base-emitter voltage of the third transistor $T_3$. In response to an increase of the drive current transistor $T_3$ becomes conductive and this transistor passes this current increase to the output terminal 3, by-passing the output transistor $T_1$. The drive current of the output transistor $T_1$ and, consequently, the maximum current through this transistor $T_1$ is limited by the current which is determined by the third resistor 17.

The value of the third resistor 17 has been chosen so that transistor $T_3$ is rendered conductive at a load current which is slightly higher than the saturation current of transistor $T_2$, so that the dissipation of the output transistor is limited, also for a load current exceeding the saturation current of $T_2$, by the additional limitation of the current through this transistor.

As described hereinbefore the fourth resistors 13 and 13' have the function of limiting the load current to a value of, for example, 100 or 200mA, as these resistors have, in combination with the value of the second resistor (6, 16), a value of 400 and 200Ω, respectively. The power dissipated by these resistors is consequently 4.0 and 2.88 Watts, respectively. In addition to their function in limiting the line currents, these resistors are used as terminating impedances of a subscriber's line connected to the terminals 12, 12'. In order to prevent the noise signals, which are in the form of in-phase signals, so-called common mode signals, from being converted when the values of the terminating impedances are not equal, into anti-phase signals, so-called differential mode signals, which group of signals also include the speech signals, the administrations require that these impedances have an accuracy of approximately 0.1%. This accuracy in combination with the large power dissipated in these impedances are the reason that the fourth resistors 13 and 13' are relatively expensive.

Figure 6:
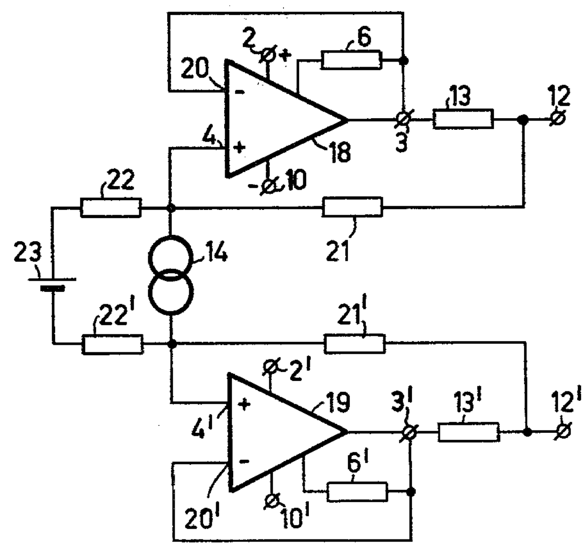
FIG. 6 shows an embodiment of a line circuit utilizing still further embodiments of amplifiers according to the invention.

The embodiment of the amplifiers in the control circuits of the line circuit shown in FIG. 6 obviates this. FIG. 6 shows a line circuit which corresponds to the line circuit shown in FIG. 3, the integrable portions of the control circuits 8 and 9, shown in FIG. 3, comprising differential amplifiers having signal inverting inputs 20 and 20'. These differential amplifiers have their output terminals 3 and 3' connected to the signal inverting inputs 20 and 20', so that these amplifiers have a defined gain factor.

Furthermore, each amplifier comprises a feedback circuit formed by a voltage divider 21, 22 and 21', 22', respectively, which include a reference voltage source 23. These voltage dividers are connected between the terminal 12 and 12', respectively, and the positive pole and the negative pole, respectively, of the reference voltage source 23. The taps of the voltage dividers 21, 22 and 21', 22' are connected to the signal non-inverting inputs 4 and 4'.

With a very high gain factor of the differential amplifiers 18 and 19 when the outputs 3 and 3' are not connected to the signal inverting inputs 20 and 20', it will be readily apparent that, when the outputs 3 and 3' are connected to the signal inverting inputs 20 and 20', the output impedance $R_0$ viewed from terminal 12 or 12' of the differential amplifier 18 is defined by:

$$R_O = \frac{R_{21} + R_{22}}{R_{21} + R_{13}} \cdot R_{13}$$

The same formula applies to differential amplifier 19, all quantities then being provided with indices. In addition, the reference numerals of the resistors denoted by R correspond to the reference numerals of the resistors in FIG. 6. With a suitable choice of the value of these resistors, for example $R_{21}=1$ kOhm and $R_{22}=9$ kOhm, an output impedance $R_0$ of 200 and 400 Ohm, respectively, is obtained for a value of 20 and 40 Ohm, respectively, for the fourth resistor 13. This also holds for the fourth resistor 13', when a value is chosen for the resistors 21' and 22' which is equally suitable as proposed for the resistors 21 and 22. The fourth resistors $R_{13}$ and $R_{13}'$ respectively, dissipate at 100 mA only 0.2 and 0.4 Watt, respectively. Relatively cheap resistors, having an accuracy of 0.1% are commercially available for these values.

The remaining 180 and 360 Ohm, respectively, of the terminating impedances 13 and 13' are constituted by the electronic impedances of the output transistors $T_1$ and $T_1'$. These impedances are easily translated into an electronic impedance in the collector circuit of the transistors $T_2$ and $T_2'$, respectively, which in combination with the impedances 6 and 6', already present, would result in a value of approximately 350 Ohm. In order to drive the transistors $T_2$ and $T_2'$ to the saturated state, the second resistors 6 and 6' must be adapted to the above-mentioned supply voltages of 48 and 60 Volt. However, these resistors need not have an accuracy of 0.1% because a value which is not perfectly correct is compensated by a small correction current of the current passed through the output transistor $T_1$ and $T_1'$, respectively, so that cheap resistors may be used.

What is claimed is:

1. An amplifier for use in a line circuit comprising an output impedance, an output transistor, a d.c. voltage source, said voltage source being coupled for direct current to a subscriber line connecting terminal of said amplifier by means of a main current path of said output transistor for applying by means of said output impedance a direct current and an alternating current superimposed on said direct current to a load such as a wire of said subscriber's line connected to said connecting terminal, a first resistor which is arranged in series with said main current path of said output transistor between said voltage source and an output terminal that is coupled to said subscriber line connecting terminal, and a second transistor which has its base-emitter junction connected across said first resistor and coupled to said connecting terminal of the amplifier by means of the series arrangement of said main current path of said second transistor and said impedance.

2. An amplifier as claimed in claim 1, wherein said emitter of said output transistor is coupled to said output terminal of said amplifier and said collector of said output transistor is coupled to the voltage source via said first resistor, and wherein said emitter of said second transistor is directly connected to the voltage source and said impedance comprises a second resistor which is arranged between the collector of the second transistor and said output terminal.

3. An amplifier as claimed in claim 1, wherein said emitter of said output transistor is connected to said output terminal of said amplifier via said first resistor, and said collector of said output transistor is connected to said voltage source, said emitter of said second transistor is connected to said output of said amplifier and said collector of said second transistor is connected to said voltage source via at least a portion of said impedance.

4. An amplifier as claimed in claim 2, wherein said amplifier comprises a third resistor arranged between the emitter of said output transistor and said output terminal of said amplifier, and said amplifier comprises a third transistor which has its base connected to the emitter of said output transistor, its emitter to said output terminal of said amplifier and its collector to the base of said output transistor.

5. An amplifier as claimed in claim 1 wherein said amplifier has a defined gain factor, and wherein said impedance comprises a fourth resistor arranged between said output terminal and said connecting terminal and wherein a feedback circuit comprising a reference voltage source is connected between said connecting terminal and the input of the amplifier for feeding back a portion of the voltage difference between the voltage of said connecting terminal and the voltage of said reference voltage source.

* * * * *